(12) United States Patent
Zhang et al.

(10) Patent No.: US 11,328,219 B2
(45) Date of Patent: May 10, 2022

(54) SYSTEM AND METHOD FOR TRAINING A MACHINE LEARNING MODEL DEPLOYED ON A SIMULATION PLATFORM

(71) Applicant: Baidu USA LLC, Sunnyvale, CA (US)

(72) Inventors: Liangliang Zhang, Sunnyvale, CA (US); Siyang Yu, Sunnyvale, CA (US); Dong Li, Sunnyvale, CA (US); Jiangtao Hu, Sunnyvale, CA (US); Jiaming Tao, Sunnyvale, CA (US); Yifei Jiang, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 704 days.

(21) Appl. No.: 15/952,089

(22) Filed: Apr. 12, 2018

(65) Prior Publication Data

US 2019/0318267 A1    Oct. 17, 2019

(51) Int. Cl.
*G06N 20/00* (2019.01)
*G07C 5/08* (2006.01)
*G06F 30/20* (2020.01)

(52) U.S. Cl.
CPC .............. *G06N 20/00* (2019.01); *G06F 30/20* (2020.01); *G07C 5/085* (2013.01)

(58) Field of Classification Search
CPC ......... G06N 20/00; G06F 30/20; G06F 30/27; G07C 5/085

USPC .......................................................... 706/12
See application file for complete search history.

(56) References Cited

U.S. PATENT DOCUMENTS

| 10,175,697 | B1* | 1/2019 | Sachdeva | |
|---|---|---|---|---|
| 2010/0238009 | A1* | 9/2010 | Cook | 340/439 |
| 2010/0250021 | A1* | 9/2010 | Cook | 701/1 |
| 2014/0195214 | A1* | 7/2014 | Kozloski | G06F 17/5009 703/8 |
| 2018/0053108 | A1* | 2/2018 | Olabiyi | G06N 7/005 |
| 2019/0001964 | A1* | 1/2019 | Lin | B60W 30/02 |
| 2019/0101914 | A1* | 4/2019 | Coleman, II | G05D 1/0055 |

* cited by examiner

*Primary Examiner* — Russell Frejd
*Assistant Examiner* — Anthony M Gartrelle
(74) *Attorney, Agent, or Firm* — Womble Bond Dickinson (US) LLP

(57) ABSTRACT

System and method for training a machine learning model are disclosed. In one embodiment, for each of the driving scenarios, responsive to sensor data from one or more sensors of a vehicle and the driving scenario, driving statistics and environment data of the vehicle are collected while the vehicle is driven by a human driver in accordance with the driving scenario. Upon completion of the driving scenario, the driver is requested to select a label for the completed driving scenario and the selected label is stored responsive to the driver selection. Features are extracted from the driving statistics and the environment data based on predetermined criteria. The extracted features include some of the driving statistics and some of the environment data collected at the different points in time during the driving scenario.

15 Claims, 10 Drawing Sheets

| Identifiers 602 | Timestamp 603 | Driving Statistics 604 | Environment Data 605 |
|---|---|---|---|
| Obstacle 1 | Ti | ... | ... |
| Obstacle 2 | Ti | ... | ... |
| Obstacle 3 | Ti | ... | ... |
| ... | ... | ... | ... |
| Obstacle N | Ti | ... | ... |
| Vehicle ID | Ti | ... | ... |

Driving Scenario 601

SYSTEM AND METHOD FOR TRAINING A MACHINE LEARNING MODEL DEPLOYED ON A SIMULATION PLATFORM

TECHNICAL FIELD

Embodiments of the present disclosure relate generally to operating autonomous vehicles. More particularly, embodiments of the disclosure relate to system and method for training a machine learning model deployed on a simulation platform.

BACKGROUND

Vehicles operating in an autonomous mode (e.g., driverless) can relieve occupants, especially the driver, from some driving-related responsibilities. When operating in an autonomous mode, the vehicle can navigate to various locations using onboard sensors, allowing the vehicle to travel with minimal human interaction or in some cases without any passengers.

Motion planning and control are critical operations in autonomous driving. However, conventional motion planning operations estimate the difficulty of completing a given path mainly from its curvature and speed, without considering the differences in features for different types of vehicles. Same motion planning and control is applied to all types of vehicles, which may not be accurate and smooth under some circumstances.

In order to improve the motion and planning control operations in autonomous driving, autonomous driving simulators are generally used to evaluate software performance of such software component (e.g., perception and planning control). For example, conventional simulators generally evaluate a software component based on a predefined grading system, which includes a series of grading metrics. Such grading system, however, is ineffective in many driving scenarios (e.g., cornering scenarios) and often fails when such driving scenarios require different combination of metrics to define.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Figure 1:
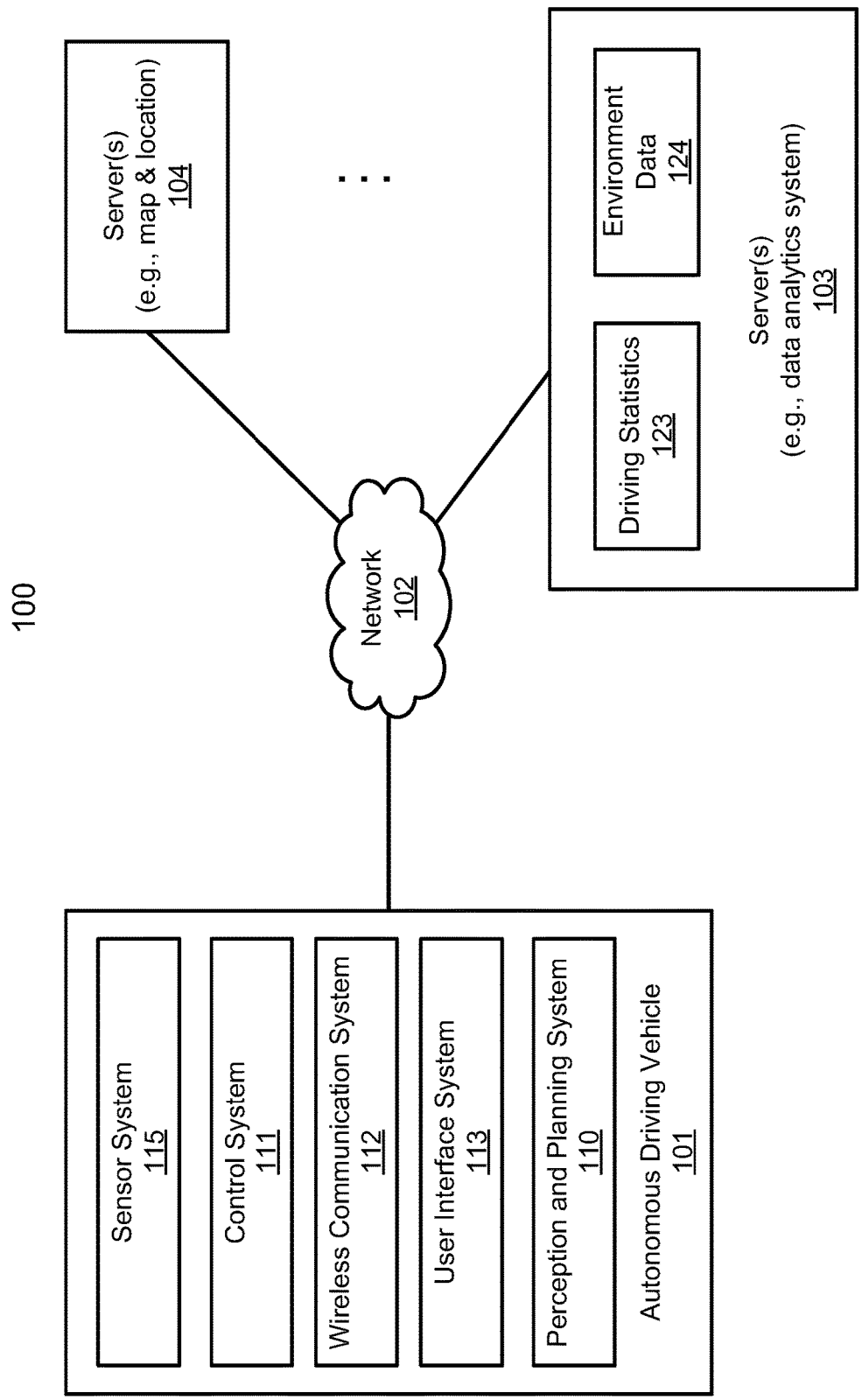
FIG. 1 is a block diagram illustrating a networked system according to one embodiment.

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

According to some embodiments, the system collects a human driver's driving statistics and environment data associated with a driving scenario while the human driver operates the vehicle in accordance with the driving scenario. For example, the system communicates with one or more sensors from a vehicle (e.g., autonomous vehicle) to obtain sensor data associated with the driving style of the human driver. The collected driving statistics and environment data are stored on a remote server (e.g., cloud storage) and/or locally on a persistent storage device. The system receives (or retrieves) the collected driving statistics and environment data from the remote server and/or persistent storage device to extract features from the collected driving statistics and environment data. The extracted features are used to train algorithms/models (e.g., machine learning models), which can be deployed to an offline autonomous driving simulation platform to evaluate the performance of an autonomous driving software component (e.g., perception and planning control). This way, the autonomous driving software component can be improved to handle difficult driving scenarios (e.g., cornering scenarios), thereby ensuring the safety of the human user of an autonomous driving vehicle.

In one embodiment, for each of the driving scenarios, responsive to sensor data from one or more sensors of a vehicle and the driving scenario, driving statistics and environment data of the vehicle are collected while the vehicle is driven by a human driver in accordance with the driving scenario. Upon completion of the driving scenario, the driver is requested to select a label for the completed driving scenario and the selected label is stored responsive to the driver selection. Features are extracted from the driving statistics and the environment data based on predetermined criteria. The extracted features include some of the driving statistics and some of the environment data collected at the different points in time during the driving scenario.

In one embodiment, a machine learning model is trained to continuously learn driving behaviors and preferences of the human driver under the plurality of driving scenarios using the extracted features and a plurality of labels.

In one embodiment, subsequent to collecting driving statistics and environment data of the vehicle, the collected driving statistics and the environment data are stored remotely onto a server. Prior to extracting features from the driving statistics and the environment data, the collected driving statistics and the environment data are retrieved from the server.

FIG. 1 is a block diagram illustrating an autonomous vehicle network configuration according to one embodiment of the disclosure. Referring to FIG. 1, network configuration 100 includes autonomous vehicle 101 that may be communicatively coupled to one or more servers 103-104 over a network 102. Although there is one autonomous vehicle shown, multiple autonomous vehicles can be coupled to each other and/or coupled to servers 103-104 over network 102. Network 102 may be any type of networks such as a local area network (LAN), a wide area network (WAN) such as the Internet, a cellular network, a satellite network, or a combination thereof, wired or wireless. Server(s) 103-104 may be any kind of servers or a cluster of servers, such as Web or cloud servers, application servers, backend servers, or a combination thereof. Servers 103-104 may be data analytics servers, content servers, traffic information servers, map and point of interest (MPOI) severs, or location servers, etc.

An autonomous vehicle refers to a vehicle that can be configured to in an autonomous mode in which the vehicle navigates through an environment with little or no input from a driver. Such an autonomous vehicle can include a sensor system having one or more sensors that are configured to detect information about the environment in which the vehicle operates. The vehicle and its associated controller(s) use the detected information to navigate through the environment. Autonomous vehicle 101 can operate in a manual mode, a full autonomous mode, or a partial autonomous mode.

In one embodiment, autonomous vehicle 101 includes, but is not limited to, perception and planning system 110, vehicle control system 111, wireless communication system 112, user interface system 113, infotainment system (not shown), and sensor system 115. Autonomous vehicle 101 may further include certain common components included in ordinary vehicles, such as, an engine, wheels, steering wheel, transmission, etc., which may be controlled by vehicle control system 111 and/or perception and planning system 110 using a variety of communication signals and/or commands, such as, for example, acceleration signals or commands, deceleration signals or commands, steering signals or commands, braking signals or commands, etc.

Components 110-115 may be communicatively coupled to each other via an interconnect, a bus, a network, or a combination thereof. For example, components 110-115 may be communicatively coupled to each other via a controller area network (CAN) bus. A CAN bus is a vehicle bus standard designed to allow microcontrollers and devices to communicate with each other in applications without a host computer. It is a message-based protocol, designed originally for multiplex electrical wiring within automobiles, but is also used in many other contexts.

Figure 2:
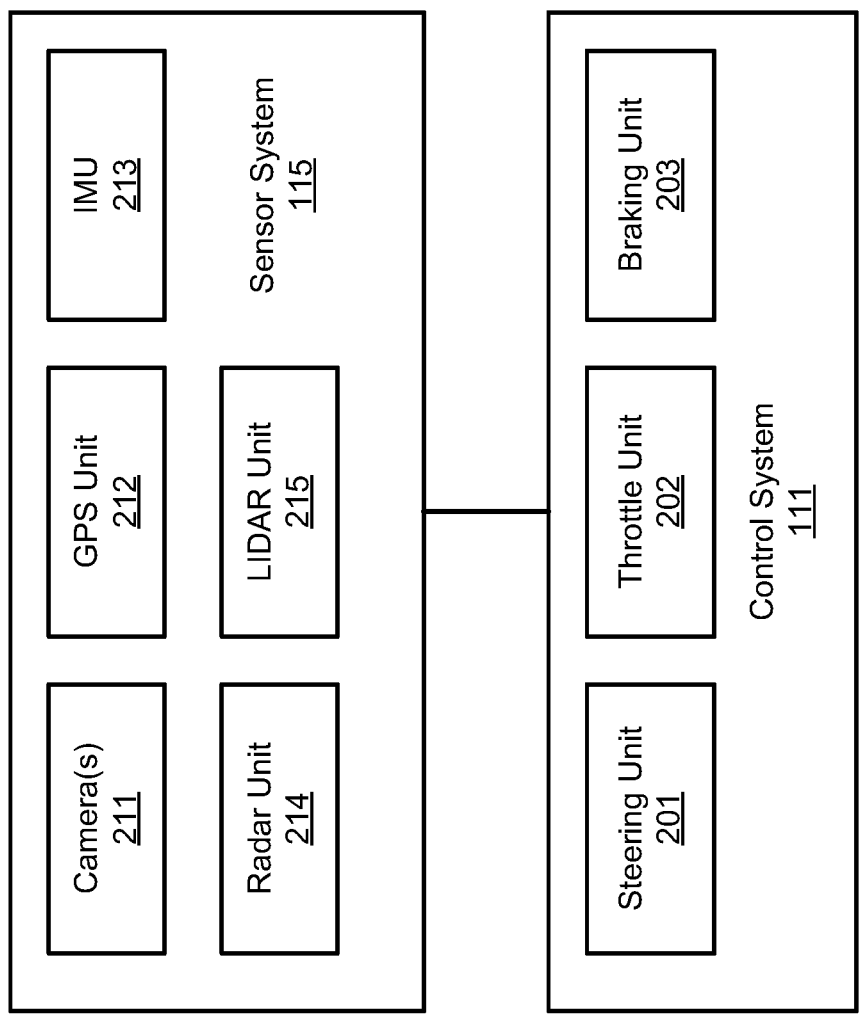
FIG. 2 is a block diagram illustrating an example of an autonomous vehicle according to one embodiment.

Referring now to FIG. 2, in one embodiment, sensor system 115 includes, but it is not limited to, one or more cameras 211, global positioning system (GPS) unit 212, inertial measurement unit (IMU) 213, radar unit 214, and a light detection and range (LIDAR) unit 215. GPS system 212 may include a transceiver operable to provide information regarding the position of the autonomous vehicle. IMU unit 213 may sense position and orientation changes of the autonomous vehicle based on inertial acceleration. Radar unit 214 may represent a system that utilizes radio signals to sense objects within the local environment of the autonomous vehicle. In some embodiments, in addition to sensing objects, radar unit 214 may additionally sense the speed and/or heading of the objects. LIDAR unit 215 may sense objects in the environment in which the autonomous vehicle is located using lasers. LIDAR unit 215 could include one or more laser sources, a laser scanner, and one or more detectors, among other system components. Cameras 211 may include one or more devices to capture images of the environment surrounding the autonomous vehicle. Cameras 211 may be still cameras and/or video cameras. A camera may be mechanically movable, for example, by mounting the camera on a rotating and/or tilting a platform.

Sensor system 115 may further include other sensors, such as, a sonar sensor, an infrared sensor, a steering sensor, a throttle sensor, a braking sensor, and an audio sensor (e.g., microphone). An audio sensor may be configured to capture sound from the environment surrounding the autonomous vehicle. A steering sensor may be configured to sense the steering angle of a steering wheel, wheels of the vehicle, or a combination thereof. A throttle sensor and a braking sensor sense the throttle position and braking position of the vehicle, respectively. In some situations, a throttle sensor and a braking sensor may be integrated as an integrated throttle/braking sensor.

In one embodiment, vehicle control system 111 includes, but is not limited to, steering unit 201, throttle unit 202 (also referred to as an acceleration unit), and braking unit 203. Steering unit 201 is to adjust the direction or heading of the vehicle. Throttle unit 202 is to control the speed of the motor or engine that in turn control the speed and acceleration of the vehicle. Braking unit 203 is to decelerate the vehicle by providing friction to slow the wheels or tires of the vehicle. Note that the components as shown in FIG. 2 may be implemented in hardware, software, or a combination thereof.

Referring back to FIG. 1, wireless communication system 112 is to allow communication between autonomous vehicle 101 and external systems, such as devices, sensors, other vehicles, etc. For example, wireless communication system 112 can wirelessly communicate with one or more devices directly or via a communication network, such as servers 103-104 over network 102. Wireless communication system 112 can use any cellular communication network or a wireless local area network (WLAN), e.g., using WiFi to communicate with another component or system. Wireless communication system 112 could communicate directly with a device (e.g., a mobile device of a passenger, a display device, a speaker within vehicle 101), for example, using an infrared link, Bluetooth, etc. User interface system 113 may be part of peripheral devices implemented within vehicle 101 including, for example, a keyboard, a touch screen display device, a microphone, and a speaker, etc.

Some or all of the functions of autonomous vehicle 101 may be controlled or managed by perception and planning system 110, especially when operating in an autonomous driving mode. Perception and planning system 110 includes the necessary hardware (e.g., processor(s), memory, storage) and software (e.g., operating system, planning and routing programs) to receive information from sensor system 115, control system 111, wireless communication system 112, and/or user interface system 113, process the received information, plan a route or path from a starting point to a destination point, and then drive vehicle 101 based on the planning and control information. Alternatively, perception and planning system 110 may be integrated with vehicle control system 111.

For example, a user as a passenger may specify a starting location and a destination of a trip, for example, via a user interface. Perception and planning system 110 obtains the trip related data. For example, perception and planning system 110 may obtain location and route information from an MPOI server, which may be a part of servers 103-104. The location server provides location services and the MPOI server provides map services and the POIs of certain locations. Alternatively, such location and MPOI information may be cached locally in a persistent storage device of perception and planning system 110.

While autonomous vehicle 101 is moving along the route, perception and planning system 110 may also obtain real-time traffic information from a traffic information system or server (TIS). Note that servers 103-104 may be operated by a third party entity. Alternatively, the functionalities of servers 103-104 may be integrated with perception and planning system 110. Based on the real-time traffic information, MPOI information, and location information, as well as real-time local environment data detected or sensed by sensor system 115 (e.g., obstacles, objects, nearby vehicles), perception and planning system 110 can plan an optimal route and drive vehicle 101, for example, via control system 111, according to the planned route to reach the specified destination safely and efficiently.

According to one embodiment, server 103 may include driving statistics 123 and environment data 124. As discussed in more detail herein below, a data collector (e.g., data collector 308 of FIG. 3A) automatically collects and stores driving statistics 123 and environment data 124 onto server 103 while autonomous vehicle 101 is operating or driven in a manual driving mode by a human driver. In one embodiment, driving statistics 123 may describe vehicle states of vehicle 101 and include information indicating the driving commands (e.g., throttle, brake, steering commands) issued and/or responses of the vehicle (e.g., speed, accelerations, decelerations, directions, acceleration changing rate) captured by sensors of the vehicle at different points in time. Environment data 124 may include information describing a driving environment at different points in time, such as, for example, routes (including starting and destination locations), MPOIs, road conditions, weather conditions, obstacle information, etc.

Based on driving statistics 123 and environment data 124, a machine learning engine (e.g., machine learning engine 310 of FIG. 3A) may generate or train a set of rules, algorithms, and/or predictive models for a variety of purposes, such as to perform an offline autonomous driving simulation in order to evaluate a software component (e.g., perception and planning control) of an autonomous driving vehicle, as discussed in more detail herein below.

Figure 3A:
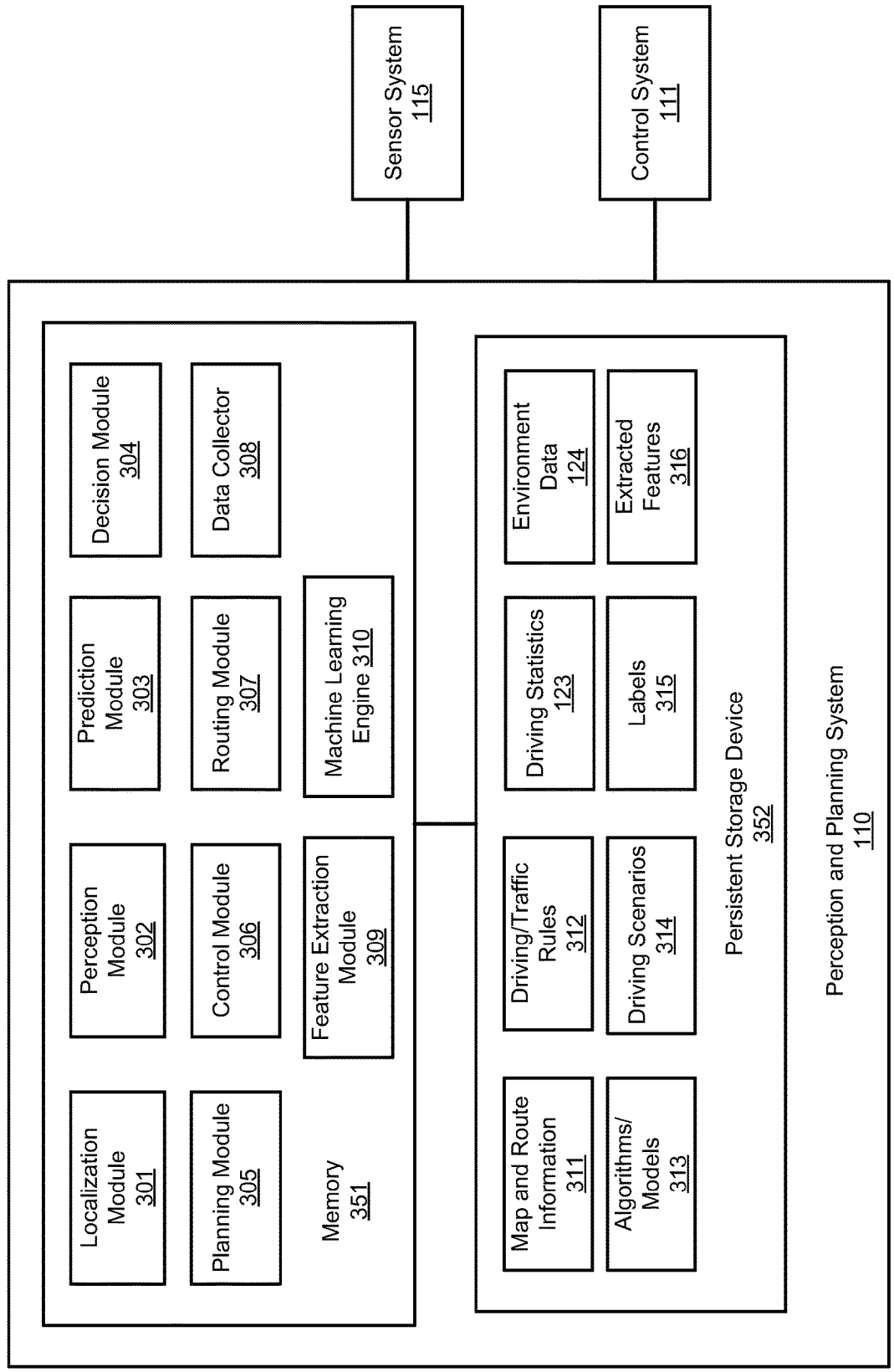
FIGS. 3A-3B are block diagrams illustrating an example of a perception and planning system used with an autonomous vehicle according to one embodiment.
Figure 3B:
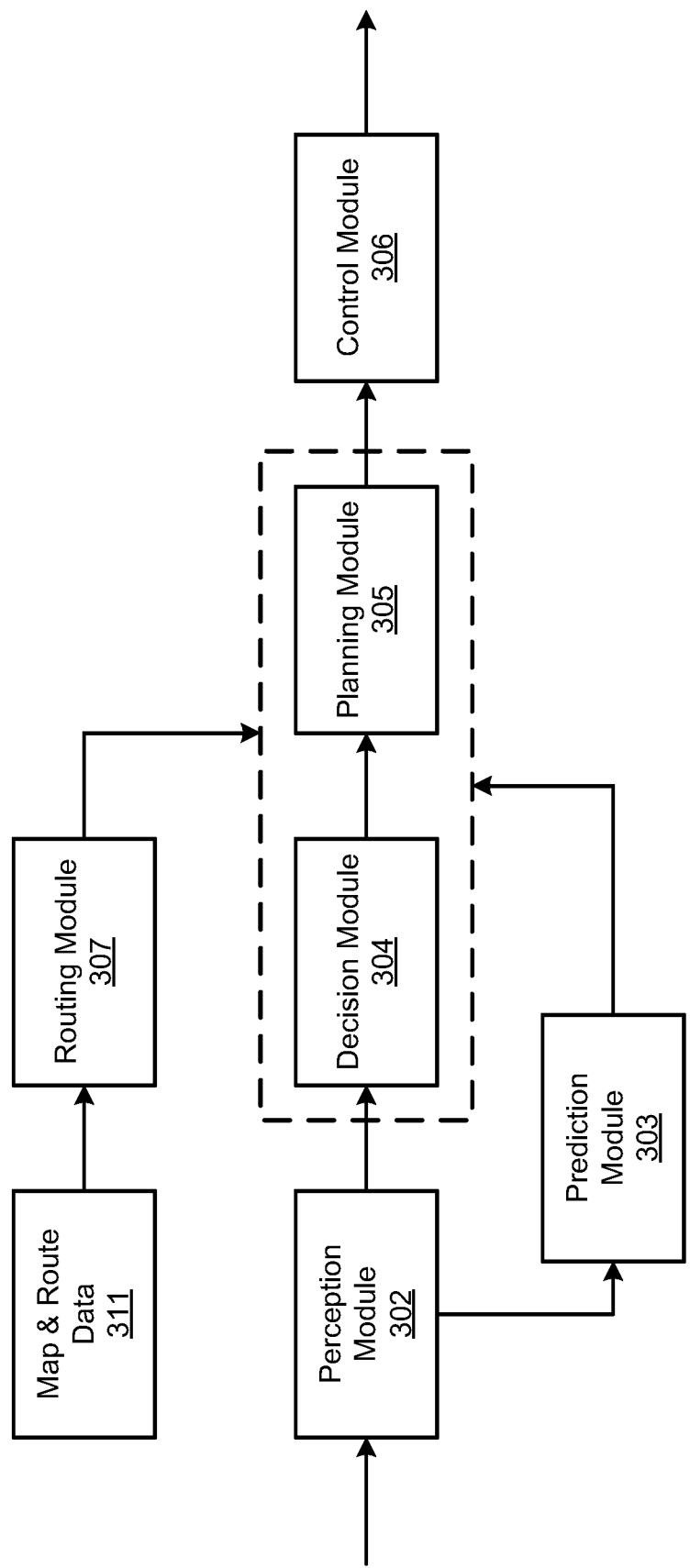

FIGS. 3A and 3B are block diagrams illustrating an example of a perception and planning system used with an autonomous vehicle according to one embodiment. System 300 may be implemented as a part of autonomous vehicle 101 of FIG. 1 including, but is not limited to, perception and planning system 110, control system 111, and sensor system 115. Referring to FIGS. 3A-3B, perception and planning system 110 includes, but is not limited to, localization module 301, perception module 302, prediction module 303, decision module 304, planning module 305, control module 306, routing module 307, data collector 308, feature extraction module 309, and machine learning engine 310.

Some or all of modules 301-310 may be implemented in software, hardware, or a combination thereof. For example, these modules may be installed in persistent storage device 352, loaded into memory 351, and executed by one or more processors (not shown). Note that some or all of these modules may be communicatively coupled to or integrated with some or all modules of vehicle control system 111 of FIG. 2. Some of modules 301-310 may be integrated together as an integrated module.

Localization module 301 determines a current location of autonomous vehicle 300 (e.g., leveraging GPS unit 212) and manages any data related to a trip or route of a user. Localization module 301 (also referred to as a map and route module) manages any data related to a trip or route of a user. A user may log in and specify a starting location and a destination of a trip, for example, via a user interface. Localization module 301 communicates with other components of autonomous vehicle 300, such as map and route information 311, to obtain the trip related data. For example, localization module 301 may obtain location and route information from a location server and a map and POI (MPOI) server. A location server provides location services and an MPOI server provides map services and the POIs of certain locations, which may be cached as part of map and route information 311. While autonomous vehicle 300 is moving along the route, localization module 301 may also obtain real-time traffic information from a traffic information system or server.

Based on the sensor data provided by sensor system 115 and localization information obtained by localization module 301, a perception of the surrounding environment is determined by perception module 302. The perception information may represent what an ordinary driver would perceive surrounding a vehicle in which the driver is driving. The perception can include the lane configuration (e.g., straight or curve lanes), traffic light signals, a relative position of another vehicle, a pedestrian, a building, crosswalk, or other traffic related signs (e.g., stop signs, yield signs), etc., for example, in a form of an object.

Perception module 302 may include a computer vision system or functionalities of a computer vision system to process and analyze images captured by one or more cameras in order to identify objects and/or features in the environment of autonomous vehicle. The objects can include traffic signals, road way boundaries, other vehicles, pedestrians, and/or obstacles, etc. The computer vision system may use an object recognition algorithm, video tracking, and other computer vision techniques. In some embodiments, the computer vision system can map an environment, track objects, and estimate the speed of objects, etc. Perception module 302 can also detect objects based on other sensors data provided by other sensors such as a radar and/or LIDAR.

For each of the objects, prediction module 303 predicts what the object will behave under the circumstances. The prediction is performed based on the perception data perceiving the driving environment at the point in time in view of a set of map/route information 311 and traffic rules 312. For example, if the object is a vehicle at an opposing direction and the current driving environment includes an intersection, prediction module 303 will predict whether the vehicle will likely move straight forward or make a turn. If the perception data indicates that the intersection has no traffic light, prediction module 303 may predict that the vehicle may have to fully stop prior to entering the intersection. If the perception data indicates that the vehicle is currently at a left-turn only lane or a right-turn only lane, prediction module 303 may predict that the vehicle will more likely make a left turn or right turn respectively.

For each of the objects, decision module 304 makes a decision regarding how to handle the object. For example, for a particular object (e.g., another vehicle in a crossing route) as well as its metadata describing the object (e.g., a speed, direction, turning angle), decision module 304 decides how to encounter the object (e.g., overtake, yield, stop, pass). Decision module 304 may make such decisions according to a set of rules such as traffic rules or driving rules 312, which may be stored in persistent storage device 352.

Routing module 307 is configured to provide one or more routes or paths from a starting point to a destination point. For a given trip from a start location to a destination location, for example, received from a user, routing module 307 obtains route and map information 311 and determines all possible routes or paths from the starting location to reach the destination location. Routing module 307 may generate a reference line in a form of a topographic map for each of the routes it determines from the starting location to reach the destination location. A reference line refers to an ideal route or path without any interference from others such as other vehicles, obstacles, or traffic condition. That is, if there is no other vehicle, pedestrians, or obstacles on the road, an ADV should exactly or closely follow the reference line. The topographic maps are then provided to decision module 304 and/or planning module 305. Decision module 304 and/or planning module 305 examine all of the possible routes to select and modify one of the most optimal route in view of other data provided by other modules such as traffic conditions from localization module 301, driving environment perceived by perception module 302, and traffic condition predicted by prediction module 303. The actual path or route for controlling the ADV may be close to or different from the reference line provided by routing module 307 dependent upon the specific driving environment at the point in time.

Based on a decision for each of the objects perceived, planning module 305 plans a path or route for the autonomous vehicle, as well as driving parameters (e.g., distance, speed, and/or turning angle), using a reference line provided by routing module 307 as a basis. That is, for a given object, decision module 304 decides what to do with the object, while planning module 305 determines how to do it. For example, for a given object, decision module 304 may decide to pass the object, while planning module 305 may determine whether to pass on the left side or right side of the object. Planning and control data is generated by planning module 305 including information describing how vehicle 300 would move in a next moving cycle (e.g., next route/path segment). For example, the planning and control data may instruct vehicle 300 to move 10 meters at a speed of 30 mile per hour (mph), then change to a right lane at the speed of 25 mph.

Based on the planning and control data, control module 306 controls and drives the autonomous vehicle, by sending proper commands or signals to vehicle control system 111, according to a route or path defined by the planning and control data. The planning and control data includes sufficient information to drive the vehicle from a first point to a second point of a route or path using appropriate vehicle settings or driving parameters (e.g., throttle, braking, and turning commands) at different points in time along the path or route.

In one embodiment, the planning phase is performed in a number of planning cycles, also referred to as command cycles, such as, for example, in every time interval of 100 milliseconds (ms). For each of the planning cycles or command cycles, one or more control commands will be issued based on the planning and control data. That is, for every 100 ms, planning module 305 plans a next route segment or path segment, for example, including a target position and the time required for the ADV to reach the target position. Alternatively, planning module 305 may further specify the specific speed, direction, and/or steering angle, etc. In one embodiment, planning module 305 plans a route segment or path segment for the next predetermined period of time such as 5 seconds. For each planning cycle, planning module 305 plans a target position for the current cycle (e.g., next 5 seconds) based on a target position planned in a previous cycle. Control module 306 then generates one or more control commands (e.g., throttle, brake, steering control commands) based on the planning and control data of the current cycle.

Note that decision module 304 and planning module 305 may be integrated as an integrated module. Decision module 304/planning module 305 may include a navigation system or functionalities of a navigation system to determine a driving path for the autonomous vehicle. For example, the navigation system may determine a series of speeds and directional headings to effect movement of the autonomous vehicle along a path that substantially avoids perceived obstacles while generally advancing the autonomous vehicle along a roadway-based path leading to an ultimate destination. The destination may be set according to user inputs via user interface system 113. The navigation system may update the driving path dynamically while the autonomous vehicle is in operation. The navigation system can incorporate data from a GPS system and one or more maps so as to determine the driving path for the autonomous vehicle.

Decision module 304/planning module 305 may further include a collision avoidance system or functionalities of a collision avoidance system to identify, evaluate, and avoid or otherwise negotiate potential obstacles in the environment of the autonomous vehicle. For example, the collision avoidance system may effect changes in the navigation of the autonomous vehicle by operating one or more subsystems in control system 111 to undertake swerving maneuvers, turning maneuvers, braking maneuvers, etc. The collision avoidance system may automatically determine feasible obstacle avoidance maneuvers on the basis of surrounding traffic patterns, road conditions, etc. The collision avoidance system may be configured such that a swerving maneuver is not undertaken when other sensor systems detect vehicles, construction barriers, etc. in the region adjacent the autonomous vehicle that would be swerved into. The collision avoidance system may automatically select the maneuver that is both available and maximizes safety of occupants of the autonomous vehicle. The collision avoidance system may select an avoidance maneuver predicted to cause the least amount of acceleration in a passenger cabin of the autonomous vehicle.

Data collector 308 collects driving statistics 123 and/or environment data 124 from a vehicle (e.g., autonomous vehicle 101 operating in manual driving mode or regular vehicle) while the vehicle is driven by a human driver in accordance with a driving scenario (e.g., one of driving scenarios 314). Driving scenarios 314 may be predetermined and stored on persistent storage device 352. In one embodiment, each of the driving scenarios 314 may include predetermined driving environment information, such as routes (including starting and destination locations), MPOIs, road conditions, traffic conditions, weather conditions, obstacle information, etc.

In one embodiment, data collector 308 may store the driving statistics 123 and environment data 124 on persistent storage device 352 and/or remotely onto server 103 (e.g., cloud storage). In one embodiment, driving statistics 123 may describe vehicle states of the vehicle and include information indicating driving commands (e.g., throttle, brake, steering commands) issued and responses of the vehicle, e.g., speeds, accelerations, decelerations, directions, rates of change of acceleration (also referred to as jerk), captured by sensors from sensor system 115 at different points in time. In one embodiment, environment data 124 includes information describing driving environments at different points in time, such as routes (including starting and destination locations), MPOIs, road conditions, weather conditions, obstacle information (e.g., obstacles and their positions, obstacle classification, obstacle speed, obstacle acceleration), and the like. In one embodiment, such information in environment data 124 may be determined using map and route information 311 and/or a high definition (HD) map.

Upon completion of each driving scenario (e.g., each of driving scenarios 314), data collector 308 may request, for example via user interface system 113, that the human driver select a label for the completed driving scenario. For example, the driver may label the driving scenario as "safe" or "comfortable" which may generate a label value of "1". On the other hand, the driver may label the driving scenario as "unsafe" or "uncomfortable" which may generate a label value of "0". In response to the driver's selection, each label corresponding to each driving scenario may be stored on the persistent storage device 352 (or server 103) as labels 315.

Feature extraction module 309 extracts (or filters) information from driving statistics 123 and environment data 124 based on predetermined criteria. Feature extraction module 309 may determine certain useful driving statistics from driving statistics 123 and environment data from environment data 124 to extract, and store the information as extracted features 316 on persistent storage device 352. For example, the predetermined criteria may decide that information indicating responses of the vehicle are useful. Accordingly, speeds, accelerations, decelerations, directions, rates of change of acceleration, etc. are extracted or filtered from driving statistics 123 and stored as part of extracted features 316. Similarly, the predetermined criteria may decide that obstacle information is useful. Accordingly, the obstacles and their positions, obstacle classification, obstacle speed, obstacle acceleration, etc. are extracted or filtered from environment data 124 and stored as part of extracted features 316.

In one embodiment, for each driving scenario (e.g., each of driving scenarios 314) and for each point in time, extracted features 316 may include obstacle identifiers (IDs), a timestamp recorded at the point in time for each obstacle identifier, vehicle speed captured at the recorded timestamp for each obstacle identifier, vehicle acceleration captured at the recorded timestamp for each obstacle identifier, vehicle rate of change of acceleration captured at the recorded timestamp for each obstacle identifier, and position (e.g., x, y, z coordinates) of the obstacle captured at the recorded timestamp for each obstacle identifier.

Extracted features 316 and labels 315 may be provided to machine learning engine 310 to generate or train a set of rules, algorithms, and/or predictive models 313 (which may be stored on persistent storage device 352). For example, in one embodiment, machine learning engine 310 may invoke one or more machine learning models/algorithms (e.g., deep learning architectures such as deep neural networks, convolutional deep neural networks, deep belief networks and/or recurrent neural networks) to continuously determine or learn driving behaviors and preferences of the human driver for each predetermined driving scenario using the provided extracted features 316 and labels 315. The trained algorithms/models 313 may be deployed to an offline simulation platform (e.g., autonomous driving simulator) to evaluate performance of a software component (e.g., perception and planning control).

According to another embodiment, the operations of feature extraction and machine learning to create models can be performed offline, for example, by another data processing system (e.g., centralized server) such as server 103. That is, a centralized server may contain feature extraction module 309 and/or machine learning engine 310 to process data collected from many vehicles and to generate an evaluation model or algorithms based on the collected data as described throughout this application.

Figure 4:
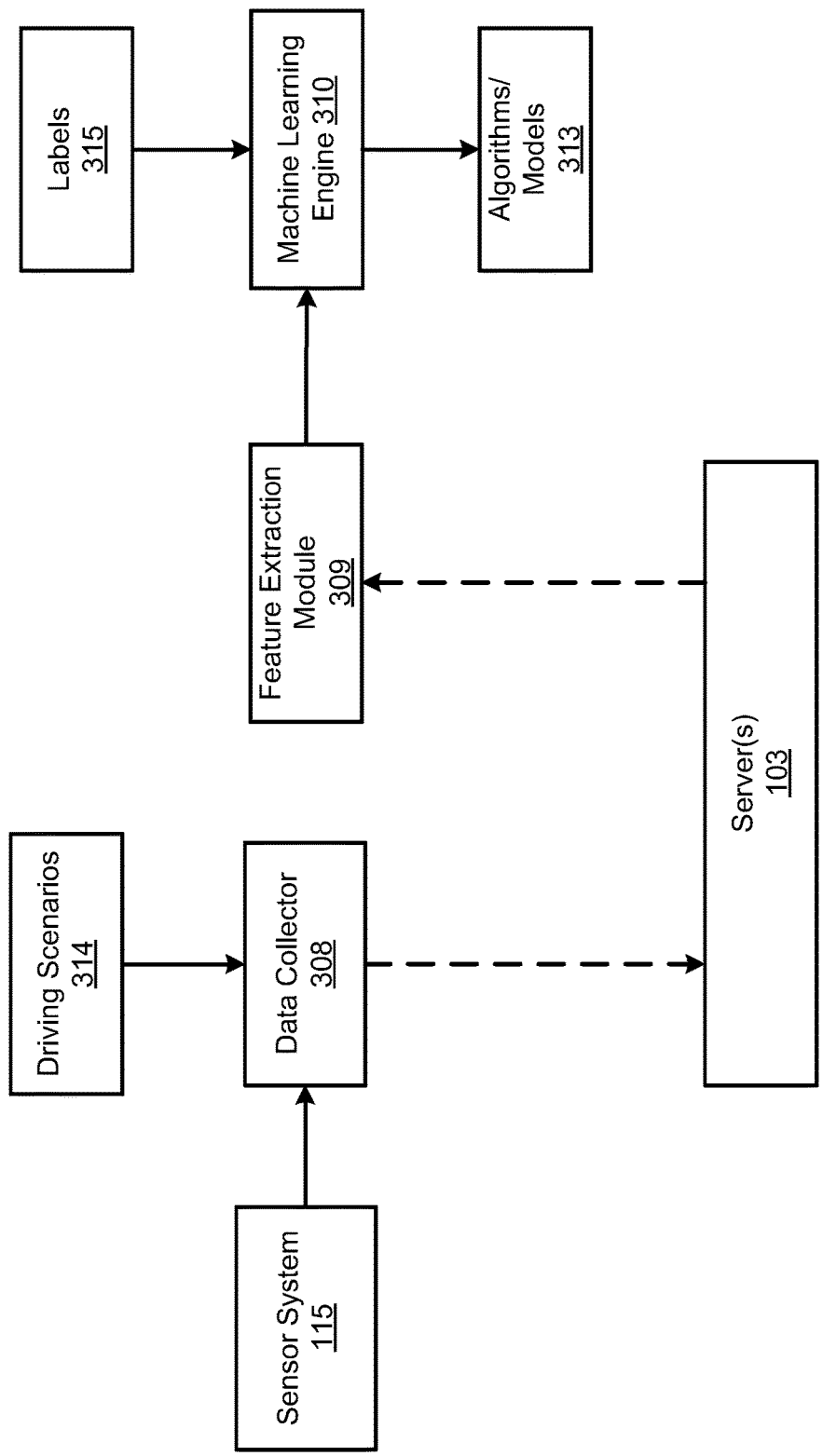
FIG. 4 is a block diagram illustrating an example of a system for training a machine learning model according to one embodiment.

FIG. 4 is a block diagram illustrating an example of a system for training a machine learning model according to one embodiment. Referring to FIG. 4, system 400 includes data collector 308, feature extraction module 309, and machine learning engine 310. In FIG. 4, in one embodiment data collector 308 receives or retrieves sensor data from sensor system 115 and driving scenarios 314 (e.g., from persistent storage device 352 or server 103). As previously described, data collector 308 collects driving statistics 123 and/or environment data 124 from a vehicle (e.g., autonomous vehicle 101 operating in manual driving mode or regular vehicle) while the vehicle is driven by a human driver in accordance with each of driving scenarios 314. The driving statistics 123 and/or environment data 124 may be locally stored (e.g., on persistent storage device 352) or remotely stored on server 103 (as shown in FIG. 4). Upon completion of each driving scenario (e.g., each of driving scenarios 314), data collector 308 may request, for example via user interface system 113, that the human driver label the completed driving scenario, and the labels may be stored as labels 315 (as previously described, and for brevity sake, will not be described again).

Figure 6:
FIG. 6 is a diagram illustrating an example of extracted features according to one embodiment.

In one embodiment, feature extraction module 309 may subsequently receive or retrieve the stored driving statistics 123 and environment data 124, extract or filter information from the driving statistics 123 and environment data 124 based on predetermined criteria. Feature extraction module 309 may then store the information as extracted features (e.g., extracted features 316 of FIG. 3A). With respect to extracted features 316, referring to FIG. 6 which is a diagram illustrating an example of extracted features according to one embodiment, extracted features 316 may include, for each driving scenario 601 (e.g., from driving scenarios 314), identifiers (IDs) 602, a timestamp 603 associated with each of the IDs 602, driving statistics 604, and environment data 605. Each of IDs 602 may be an obstacle ID (Obstacle 1 . . . Obstacle N) representing a particular obstacle in driving scenario 601. In one embodiment, IDs 602 may also include a vehicle ID representing the vehicle driven by the human driver. Timestamp 603 represents a time $T_i$, where $i \geq 0$, recorded at different points in time while driving through driving scenario 601. Driving statistics 604 may include driving statistics (which may be filtered from driving statistics 123) that are captured at the recorded time $T_1$ when the driver encounters each particular obstacle (e.g., Obstacle 1 . . . Obstacle N). In one embodiment, driving statistics 604 may include information indicating responses of the vehicle (e.g., speeds, accelerations, decelerations, directions, rates of change of acceleration, and the like). Environment data 605 may include environment data (which may be filtered from environment data 124) that are captured at the recorded time $T_i$ when the driver encounters each particular obstacle. For example, environment data 605 may include the position of each obstacle (e.g., x, y, z coordinates) captured at time $T_i$.

Referring back to FIG. 4, the extracted features and labels 315 are provided to machine learning engine 310. Machine learning engine 310 generates or trains a set of rules, algorithms, and/or predictive models 313. For example, in one embodiment, machine learning engine 310 may invoke one or more machine learning models/algorithms (e.g., deep learning architectures such as deep neural networks, convolutional deep neural networks, deep belief networks and/or recurrent neural networks) to continuously determine or learn driving behaviors and preferences of the human driver for each predetermined driving scenario using the provided extracted features and labels 315, such that the algorithms/models 313 can be invoked to operate an autonomous vehicle (e.g., vehicle 101) through different driving scenarios under a driving environment.

Figure 5:
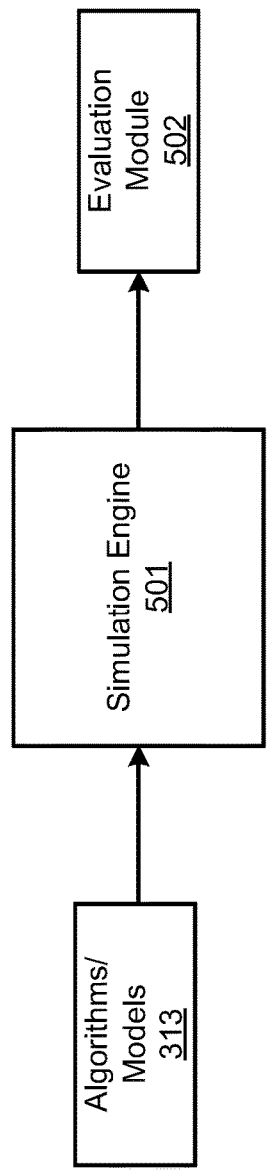
FIG. 5 is a block diagram illustrating an example of a system for evaluating an autonomous driving software component according to one embodiment.

FIG. 5 is a block diagram illustrating an example of a system for evaluating an autonomous driving software component according to one embodiment. In some embodiments, system 500 may be implemented on a client device (e.g., host or server), a personal computer (e.g., desktops, laptops, tablets, and the like), or an autonomous driving vehicle (e.g., vehicle 101 of FIG. 1).

As shown, system 500 includes a simulation engine (also referred to as simulator or simulation platform) 501 and evaluation module 502. Trained algorithms/models 313 may be deployed to simulation engine 501 for performance of autonomous driving simulation to test a software component (e.g., perception and planning control). That is, the extracted features may subsequently be utilized to evaluate behaviors of autonomous driving of one or more autonomous driving vehicles (e.g., autonomous vehicle 101 of FIG. 1). For example, simulation engine 501 may include embedded maps (e.g., HD maps), virtual driving scenarios (which may be similar to driving scenarios 314), and a test software component (e.g., perception and planning control). Using the deployed algorithms/models 313, simulation engine 501 may virtually operate a vehicle to drive through various driving scenarios under a simulation environment to test the software component. Simulation results from the simulation may be provided to evaluation module 502 for evaluation of the test software component operating with algorithms/models 313. For example, based on the simulation results (e.g., information describing states of the virtual vehicle operating under the simulation environment), evaluation module 502 may determine whether the test software component passes or fails. In doing so, evaluation module 502 may generate a probability based on the results. If the probability exceeds a threshold (e.g., 0.5, or any other suitable value between 0 and 1), evaluation module 502 may output an indication of a success or pass. Otherwise, evaluation module 502 may output an indication of a failure.

Figure 7:
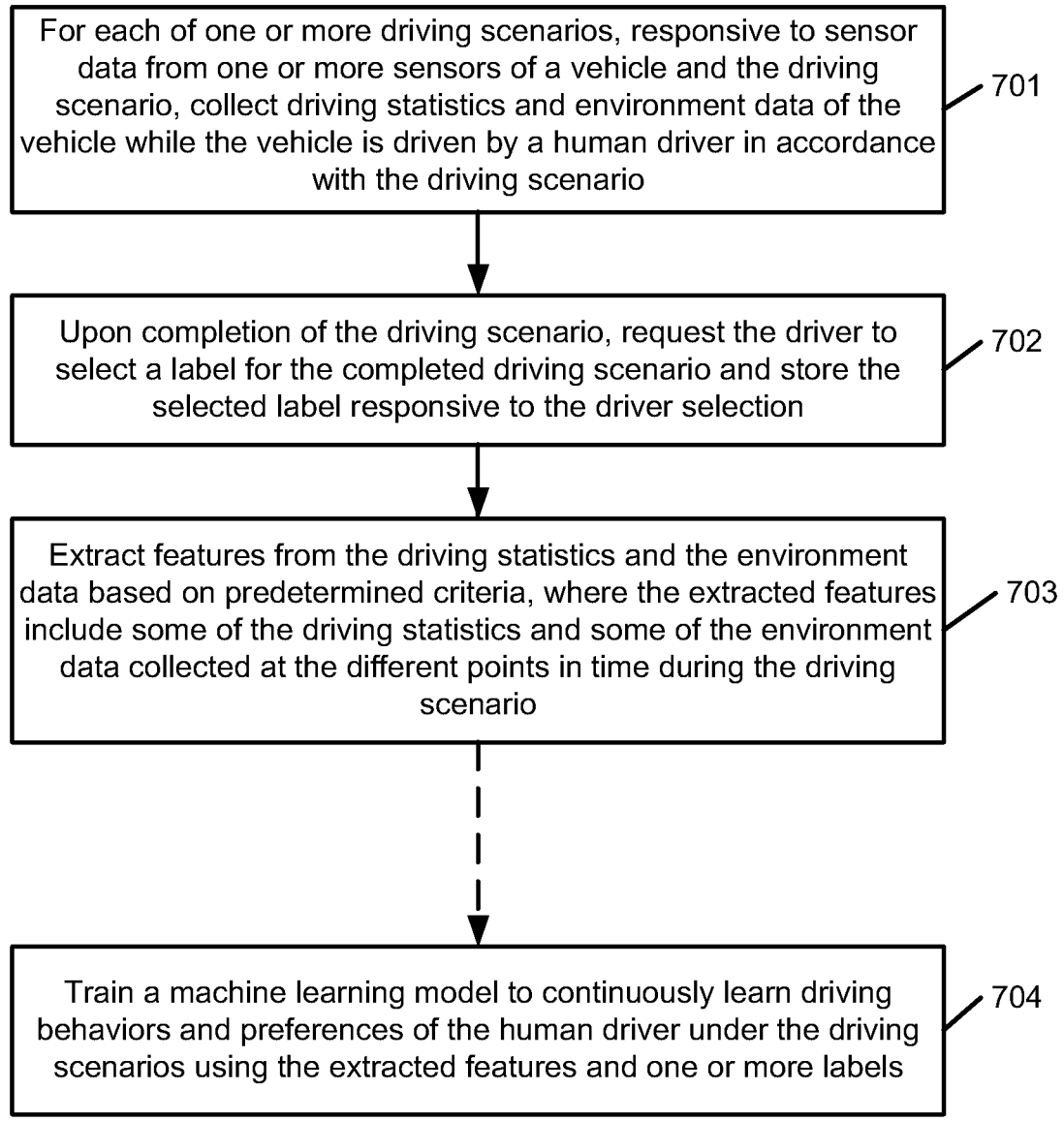
FIG. 7 is a flow diagram of a method of training a machine learning model according to one embodiment.

FIG. 7 is a flow diagram of a method of training a machine learning model according to one embodiment. Process 700 may be performed by processing logic which may include software, hardware, or a combination thereof. For example, process 700 may be performed by the perception and planning system 110 of FIG. 1. Referring to FIG. 7, at block 701, the processing logic, for each of one or more driving scenarios, responsive to sensor data from one or more sensors of a vehicle and the driving scenario, collects driving statistics and environment data of the vehicle while the vehicle is driven by a human driver in accordance with the driving scenario. At block 702, the processing logic, upon completion of the driving scenario, requests the driver to select a label for the completed driving scenario and store the selected label responsive to the driver selection. At block 703, the processing logic extracts features from the driving statistics and the environment data based on predetermined criteria, where the extracted features include some of the driving statistics and some of the environment data collected at the different points in time during the driving scenario. At block 704, the processing logic trains a machine learning model to continuously learn driving behaviors and preferences of the human driver under the driving scenarios using the extracted features and one or more labels.

Figure 8:
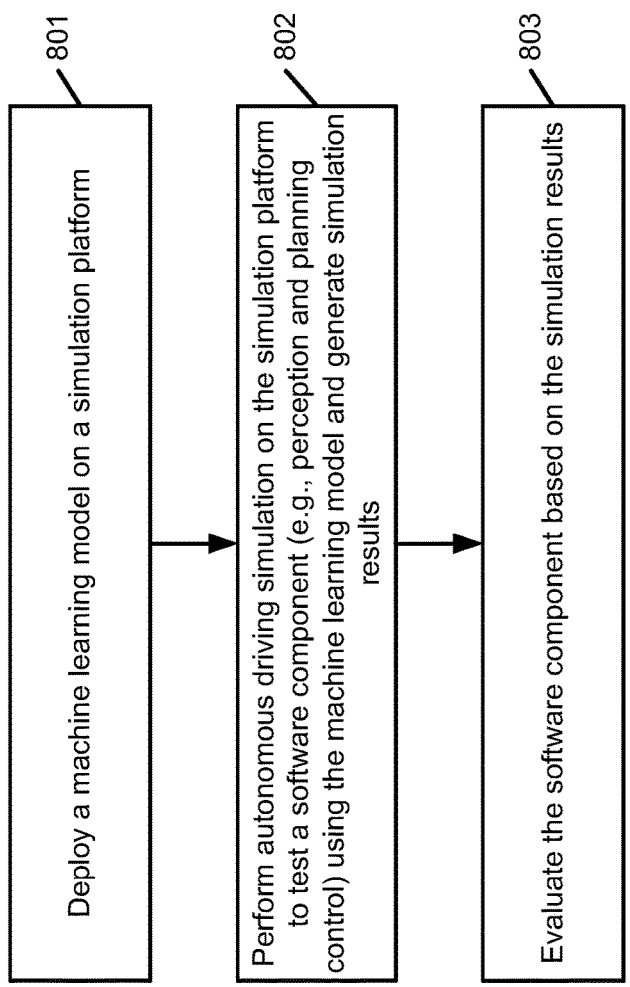
FIG. 8 is a flow diagram of a method of evaluating an autonomous driving software component according to one embodiment.

FIG. 8 is a flow diagram of a method of evaluating an autonomous driving software component according to one embodiment. Process 800 may be performed by processing logic which may include software, hardware, or a combination thereof.

At block 801, the processing logic deploys a machine learning model on a simulation platform. At block 802, the processing logic performs autonomous driving simulation on the simulation platform to test a software component (e.g., perception and planning control) using the machine learning model and generates simulation results. At block 803, the processing logic evaluates the software component based on the simulation results.

Note that some or all of the components as shown and described above may be implemented in software, hardware, or a combination thereof. For example, such components can be implemented as software installed and stored in a persistent storage device, which can be loaded and executed in a memory by a processor (not shown) to carry out the processes or operations described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Figure 9:
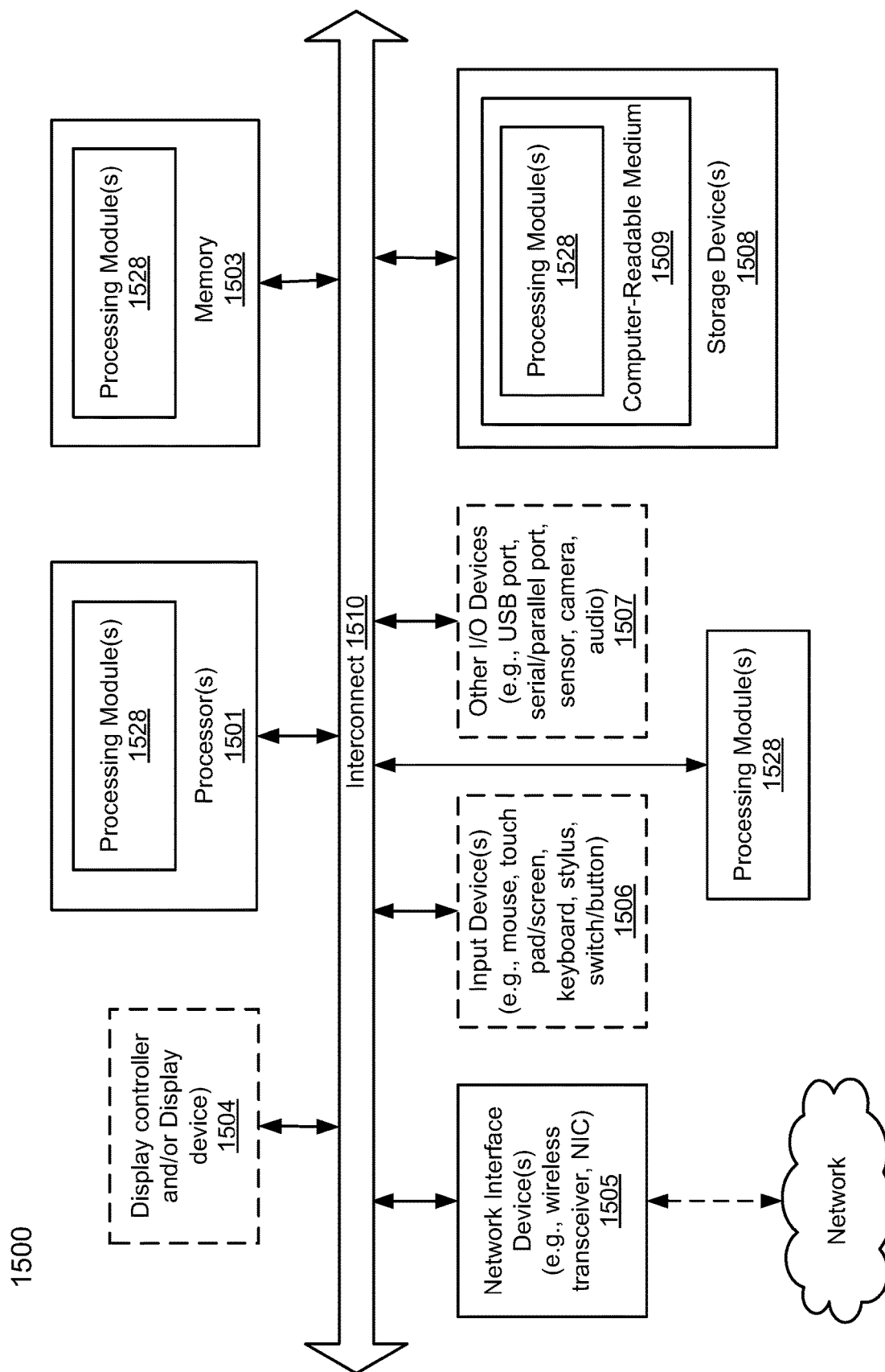
FIG. 9 is a block diagram illustrating a data processing system according to one embodiment.

FIG. 9 is a block diagram illustrating an example of a data processing system which may be used with one embodiment of the disclosure. For example, system 1500 may represent any of data processing systems described above performing any of the processes or methods described above, such as, for example, perception and planning system 110 or any of servers 103-104 of FIG. 1. System 1500 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system.

Note also that system 1500 is intended to show a high level view of many components of the computer system. However, it is to be understood that additional components may be present in certain implementations and furthermore, different arrangement of the components shown may occur in other implementations. System 1500 may represent a desktop, a laptop, a tablet, a server, a mobile phone, a media player, a personal digital assistant (PDA), a Smartwatch, a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 1500 includes processor 1501, memory 1503, and devices 1505-1508 connected via a bus or an interconnect 1510. Processor 1501 may represent a single processor or multiple processors with a single processor core or multiple processor cores included therein. Processor 1501 may represent one or more general-purpose processors such as a microprocessor, a central processing unit (CPU), or the like. More particularly, processor 1501 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 1501 may also be one or more special-purpose processors such as an application specific integrated circuit (ASIC), a cellular or baseband processor, a field programmable gate array (FPGA), a digital signal processor (DSP), a network processor, a graphics processor, a communications processor, a cryptographic processor, a co-processor, an embedded processor, or any other type of logic capable of processing instructions.

Processor 1501, which may be a low power multi-core processor socket such as an ultra-low voltage processor, may act as a main processing unit and central hub for communication with the various components of the system. Such processor can be implemented as a system on chip (SoC). Processor 1501 is configured to execute instructions for performing the operations and steps discussed herein. System 1500 may further include a graphics interface that communicates with optional graphics subsystem 1504, which may include a display controller, a graphics processor, and/or a display device.

Processor 1501 may communicate with memory 1503, which in one embodiment can be implemented via multiple memory devices to provide for a given amount of system memory. Memory 1503 may include one or more volatile storage (or memory) devices such as random access memory (RAM), dynamic RAM (DRAM), synchronous DRAM (SDRAM), static RAM (SRAM), or other types of storage devices. Memory 1503 may store information including sequences of instructions that are executed by processor 1501, or any other device. For example, executable code and/or data of a variety of operating systems, device drivers, firmware (e.g., input output basic system or BIOS), and/or applications can be loaded in memory 1503 and executed by processor 1501. An operating system can be any kind of operating systems, such as, for example, Robot Operating System (ROS), Windows® operating system from Microsoft®, Mac OS®/iOS®from Apple, Android® from Google®, LINUX, UNIX, or other real-time or embedded operating systems.

System 1500 may further include IO devices such as devices 1505-1508, including network interface device(s) 1505, optional input device(s) 1506, and other optional IO device(s) 1507. Network interface device 1505 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 1506 may include a mouse, a touch pad, a touch sensitive screen (which may be integrated with display device 1504), a pointer device such as a stylus, and/or a keyboard (e.g., physical keyboard or a virtual keyboard displayed as part of a touch sensitive screen). For example, input device 1506 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 1507 may include an audio device. An audio device may include a speaker and/or a microphone to facilitate voice-enabled functions, such as voice recognition, voice replication, digital recording, and/or telephony functions. Other IO devices 1507 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO devices 1507 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 1510 via a sensor hub (not shown), while other devices such as a keyboard or thermal sensor may be controlled by an embedded controller (not shown), dependent upon the specific configuration or design of system 1500.

To provide for persistent storage of information such as data, applications, one or more operating systems and so forth, a mass storage (not shown) may also couple to processor 1501. In various embodiments, to enable a thinner and lighter system design as well as to improve system responsiveness, this mass storage may be implemented via a solid state device (SSD). However in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 1501, e.g., via a serial peripheral interface (SPI). This flash device may provide for non-volatile storage of system software, including BIOS as well as other firmware of the system.

Storage device 1508 may include computer-accessible storage medium 1509 (also known as a machine-readable storage medium or a computer-readable medium) on which is stored one or more sets of instructions or software (e.g., module, unit, and/or logic 1528) embodying any one or more of the methodologies or functions described herein. Processing module/unit/logic 1528 may represent any of the components described above, such as, for example, planning module 305, control module 306, data collector 308, feature extraction module 309 and machine learning engine 310. Processing module/unit/logic 1528 may also reside, completely or at least partially, within memory 1503 and/or within processor 1501 during execution thereof by data processing system 1500, memory 1503 and processor 1501 also constituting machine-accessible storage media. Processing module/unit/logic 1528 may further be transmitted or received over a network via network interface device 1505.

Computer-readable storage medium 1509 may also be used to store the some software functionalities described above persistently. While computer-readable storage medium 1509 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media, or any other non-transitory machine-readable medium.

Processing module/unit/logic 1528, components and other features described herein can be implemented as discrete hardware components or integrated in the functionality of hardware components such as ASICS, FPGAs, DSPs or similar devices. In addition, processing module/unit/logic 1528 can be implemented as firmware or functional circuitry within hardware devices. Further, processing module/unit/logic 1528 can be implemented in any combination hardware devices and software components.

Note that while system 1500 is illustrated with various components of a data processing system, it is not intended to represent any particular architecture or manner of interconnecting the components; as such details are not germane to embodiments of the present disclosure. It will also be appreciated that network computers, handheld computers, mobile phones, servers, and/or other data processing systems which have fewer components or perhaps more components may also be used with embodiments of the disclosure.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A computer-implemented method of training a machine learning model for evaluating autonomous driving of an autonomous driving vehicle (ADV), the method comprising:
for each of a plurality of driving scenarios,
collecting driving statistics and environment data of the ADV from one or more sensors of the ADV, while the ADV is driven by a human driver in manual driving mode in accordance with the driving scenario,
upon completion of the driving scenario, displaying a user interface requesting the human driver to select a label for the completed driving scenario, the label indicating unsafe, safe, uncomfortable or comfortable, wherein the human driver selects the label using the user interface,
storing the selected label responsive to the selection of the human driver, and
extracting features from the driving statistics and the environment data based on predetermined criteria deciding to extract information indicating responses of the ADV and obstacle information, the extracted features including some of the driving statistics and some of the environment data collected at different points in time during the driving scenario; and
training a machine learning model to continuously learn driving behaviors and preferences of the human driver under the plurality of driving scenarios using the extracted features and a plurality of labels selected by the human driver for the plurality of driving scenarios;
wherein the trained machine learning model is deployed for performance of autonomous driving simulation that tests a perception and control system of the ADV by using the trained machine learning model to virtually operate a virtual ADV to drive through the driving scenarios under a simulation environment to test the perception and control system of the ADV;
wherein simulation results from the autonomous driving simulation are used to determine whether the perception and control system of the ADV passes or fails.

2. The method of claim 1, wherein some of the driving statistics includes information indicating responses of the ADV, and some of the environment data includes obstacle information.

3. The method of claim 1, wherein the extracted features include, for each driving scenario,
- identifiers (IDs) that include obstacle IDs representing obstacles in the driving scenario and a vehicle ID representing the ADV,
- a timestamp associated with each of the IDs, wherein the timestamp represents a time $T_i$, where i≥0, recorded at the different points in time while the ADV is driven through the driving scenario,
- information indicating responses of the ADV captured at the recorded time $T_i$, and
- obstacle information captured at the recorded time $T_i$.

4. The method of claim 2, wherein
- the information indicating responses of the ADV includes speed, acceleration, deceleration, and rate of change of acceleration of the ADV, and
- the obstacle information includes positions of obstacles.

5. The method of claim 1, further comprising:
- subsequent to collecting driving statistics and environment data of the ADV, storing the collected driving statistics and the environment data remotely onto a server; and
- prior to extracting features from the driving statistics and the environment data, retrieving the collected driving statistics and the environment data from the server.

6. A non-transitory machine-readable medium having instructions stored therein, which when executed by a processor, cause the processor to perform operations, the operations comprising:
- for each of a plurality of driving scenarios,
  - collecting driving statistics and environment data of an autonomous driving vehicle (ADV) from one or more sensors of the ADV, while the ADV is driven by a human driver in manual driving mode in accordance with the driving scenario,
  - upon completion of the driving scenario, displaying a user interface requesting the driver to select a label for the completed driving scenario, the label indicating unsafe, safe, uncomfortable or comfortable, wherein the human driver selects the label using the user interface,
  - storing the selected label responsive to the driver selection, and
  - extracting features from the driving statistics and the environment data based on predetermined criteria deciding to extract information indicating responses of the ADV and obstacle information, the extracted features including some of the driving statistics and some of the environment data collected at different points in time during the driving scenario; and
- training a machine learning model to continuously learn driving behaviors and preferences of the human driver under the plurality of driving scenarios using the extracted features and a plurality of labels selected by the human driver for the plurality of driving scenarios;
- wherein the trained machine learning model is deployed for performance of autonomous driving simulation that tests a perception and control system of the ADV by using the trained machine learning model to virtually operate a virtual ADV to drive through the driving scenarios under a simulation environment to test the perception and control system of the ADV;
- wherein simulation results from the autonomous driving simulation are used to determine whether the perception and control system of the ADV passes or fails.

7. The non-transitory machine-readable medium of claim 6, wherein some of the driving statistics includes information indicating responses of the ADV, and some of the environment data includes obstacle information.

8. The non-transitory machine-readable medium of claim 6, wherein the extracted features include, for each driving scenario,
- identifiers (IDs) that include obstacle IDs representing obstacles in the driving scenario and a vehicle ID representing the ADV,
- a timestamp associated with each of the IDs, wherein the timestamp represents a time $T_i$, where i≥0, recorded at the different points in time while the ADV is driven through the driving scenario,
- information indicating responses of the ADV captured at the recorded time $T_i$, and
- obstacle information captured at the recorded time $T_i$.

9. The non-transitory machine-readable medium of claim 7, wherein
- the information indicating responses of the ADV includes speed, acceleration, deceleration, and rate of change of acceleration of the ADV, and
- the obstacle information includes positions of obstacles.

10. The non-transitory machine-readable medium of claim 6, wherein the operations further comprise:
- subsequent to collecting driving statistics and environment data of the ADV, storing the collected driving statistics and the environment data remotely onto a server; and
- prior to extracting features from the driving statistics and the environment data, retrieving the collected driving statistics and the environment data from the server.

11. A data processing system, comprising:
- a processor; and
- a memory coupled to the processor to store instructions, which when executed by the processor, cause the processor to perform operations, the operations including
  - for each of a plurality of driving scenarios,
    - collecting driving statistics and environment data of an autonomous driving vehicle (ADV) from one or more sensors of the ADV, while the ADV is driven by a human driver in manual driving mode in accordance with the driving scenario,
    - upon completion of the driving scenario, displaying a user interface requesting the driver to select a label for the completed driving scenario, the label indicating unsafe, safe, uncomfortable or comfortable, wherein the human driver selects the label using the user interface,
    - storing the selected label responsive to the driver selection, and
    - extracting features from the driving statistics and the environment data based on predetermined criteria deciding to extract information indicating responses of the ADV and obstacle information, the extracted features including some of the driving statistics and some of the environment data collected at different points in time during the driving scenario; and
  - training a machine learning model to continuously learn driving behaviors and preferences of the human driver under the plurality of driving scenarios using the extracted features and a plurality of labels selected by the human driver for the plurality of driving scenarios;

wherein the trained machine learning model is deployed for performance of autonomous driving simulation that tests a perception and control system of the ADV by using the trained machine learning model to virtually operate a virtual ADV to drive through the driving scenarios under a simulation environment to test the perception and control system of the ADV;

wherein simulation results from the autonomous driving simulation are used to determine whether the perception and control system of the ADV passes or fails.

12. The data processing system of claim 11, wherein some of the driving statistics includes information indicating responses of the ADV, and some of the environment data includes obstacle information.

13. The data processing system of claim 11, wherein the extracted features include, for each driving scenario, identifiers (IDs) that include obstacle IDs representing obstacles in the driving scenario and a vehicle ID representing the ADV, a timestamp associated with each of the IDs, wherein the timestamp represents a time $T_i$, where i≥0, recorded at the different points in time while the ADV is driven through the driving scenario, information indicating responses of the ADV captured at the recorded time $T_i$, and obstacle information captured at the recorded time $T_i$.

14. The data processing system of claim 12, wherein the information indicating responses of the ADV includes speed, acceleration, deceleration, and rate of change of acceleration of the ADV, and the obstacle information includes positions of obstacles.

15. The data processing system of claim 11, wherein the operations further include subsequent to collecting driving statistics and environment data of the ADV, storing the collected driving statistics and the environment data remotely onto a server; and prior to extracting features from the driving statistics and the environment data, retrieving the collected driving statistics and the environment data from the server.

* * * * *